United States Patent [19]
Fukukura

[11] Patent Number: 4,561,709
[45] Date of Patent: Dec. 31, 1985

[54] MEMBRANE TYPE CIRCUIT HAVING IMPROVED TAIL

[75] Inventor: Kazutoyo Fukukura, Reading, Mass.

[73] Assignee: AMP Incorporated, Harrisburg, Pa.

[21] Appl. No.: 559,656

[22] Filed: Dec. 9, 1983

[51] Int. Cl.⁴ .......................... H05K 1/00; H01R 4/02
[52] U.S. Cl. ................................ 339/17 F; 339/97 C
[58] Field of Search ............ 339/17 F, 97 C, 176 MF

[56] References Cited

U.S. PATENT DOCUMENTS

| 2,014,524 | 9/1935 | Franz | 339/17 F |
| 2,911,605 | 11/1959 | Wales, Jr. | 339/17 F |
| 3,633,189 | 1/1972 | Billawala | 339/17 F |
| 3,697,925 | 10/1972 | Henschen | 339/176 MF |
| 3,805,213 | 4/1974 | Austin | 339/17 F |
| 4,315,662 | 2/1982 | Greenwood et al. | 339/17 F |
| 4,460,224 | 7/1984 | Stopper | 339/17 F |

OTHER PUBLICATIONS

Malco Manufacturing Company, Bulletin 705, 1970.

Primary Examiner—Joseph H. McGlynn
Assistant Examiner—Gary F. Paumen
Attorney, Agent, or Firm—Frederick W. Raring

[57] ABSTRACT

Membrane type circuit comprises an insulating support having terminal sites thereon and circuit conductors extending between and among the terminal sites. A tail extends from the support and the conductors extend onto the tail and have output terminals on the tail. The tail is folded so that the output terminals on each side of the fold line are against each other and are connected to each other. Each pair of conductors which extends from two opposed output terminals are therefore a dual conductor. This arrangement simplifies circuit design and avoids the need for crossovers in many circumstances.

10 Claims, 8 Drawing Figures

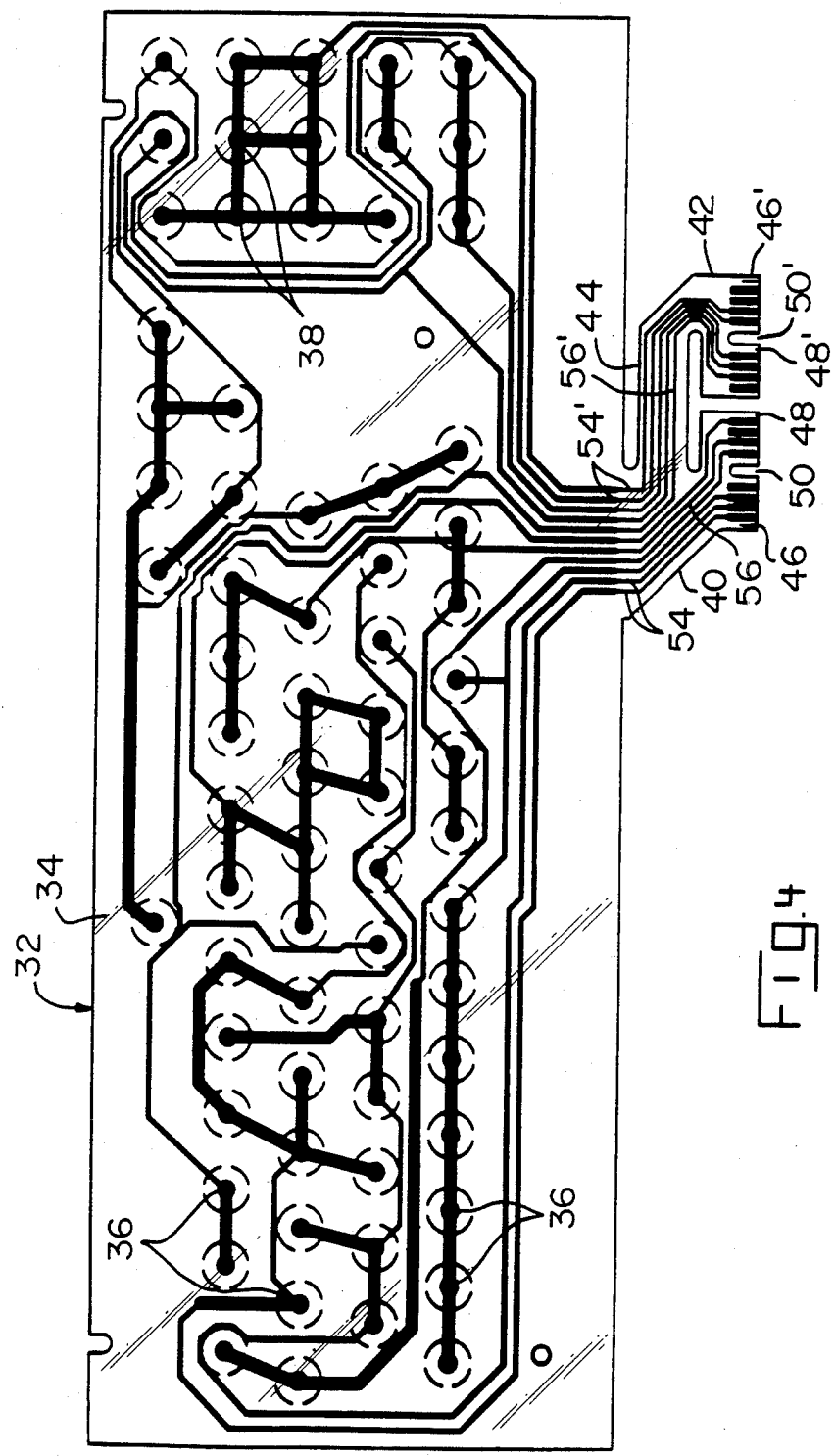

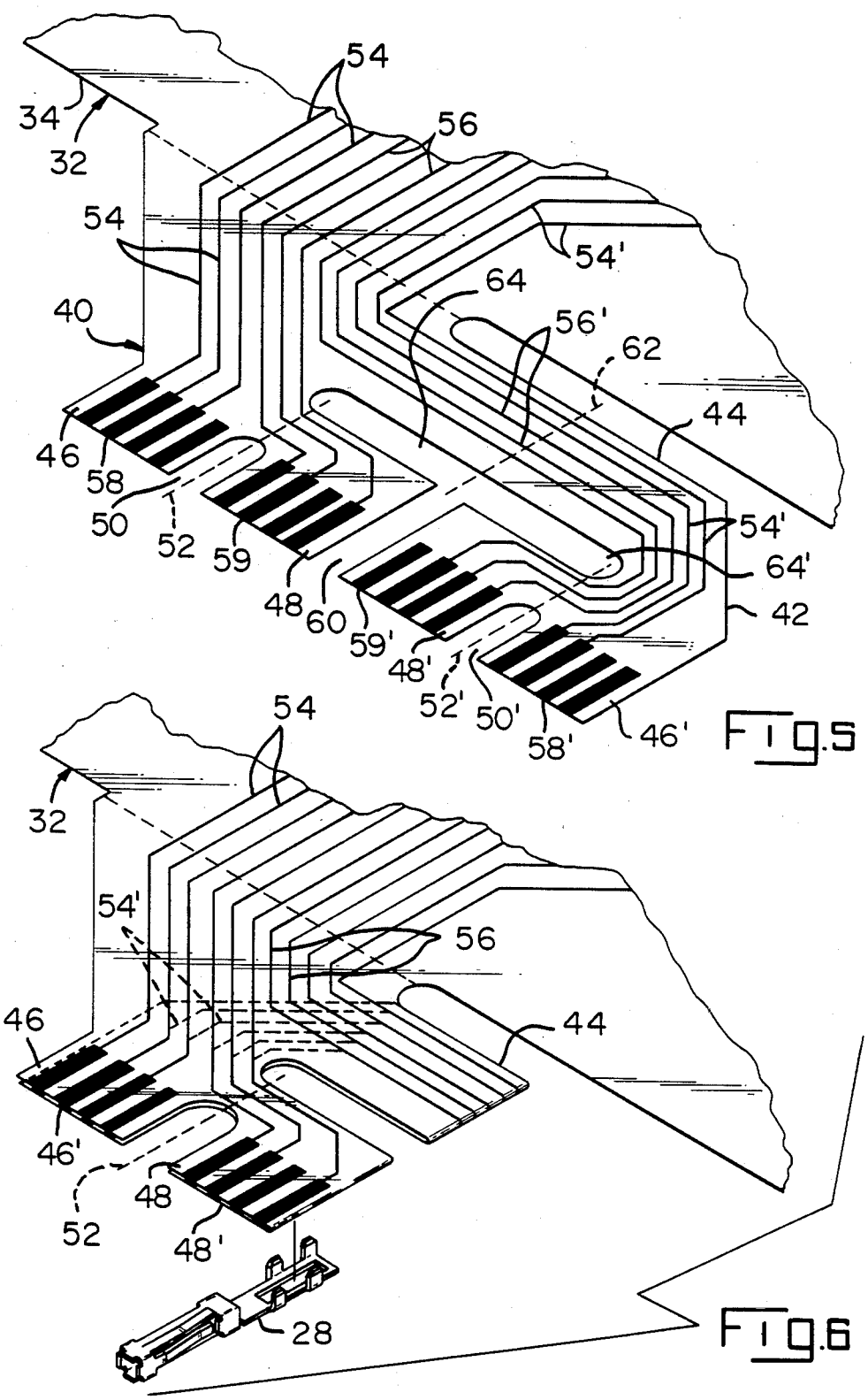

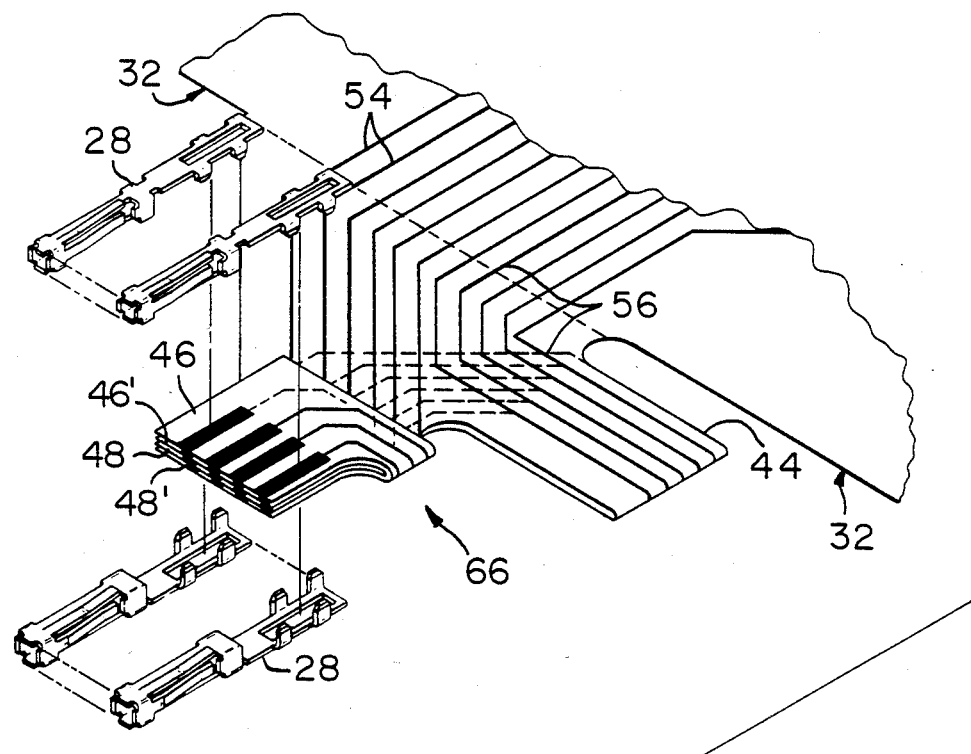
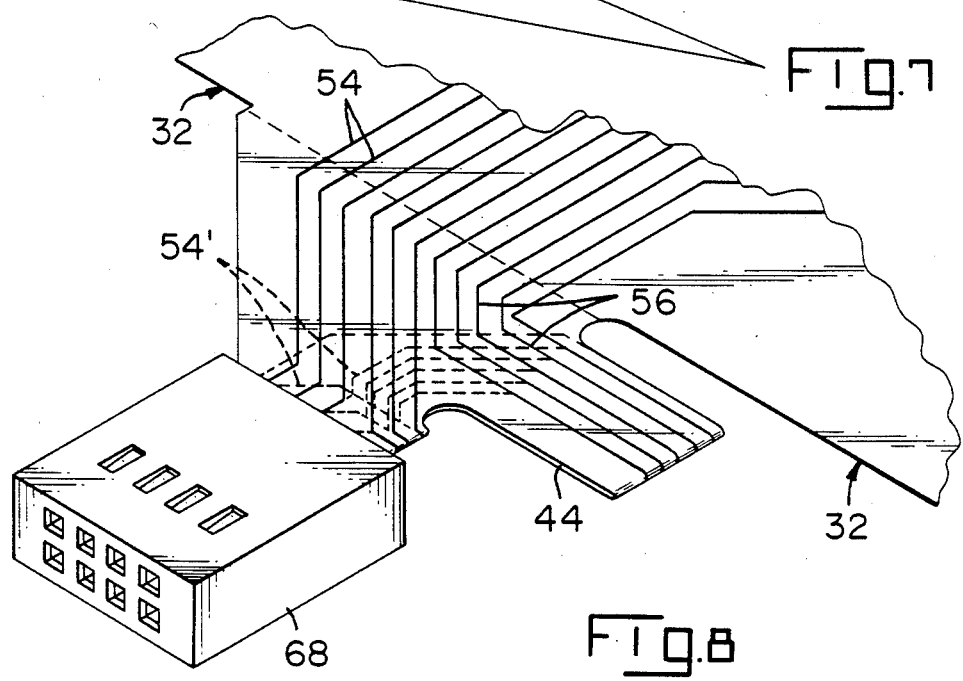

MEMBRANE TYPE CIRCUIT HAVING IMPROVED TAIL

FIELD OF THE INVENTION

This invention relates to electrical circuits of the type comprising conductors which are silkscreened or electro-deposited on a surface and which extend to a tail by means of which the conductors are connected to external circuitry. The invention is particularly directed to the achievement of an improved tail which simplifies the design or layout of the circuit.

BACKGROUND OF THE INVENTION

A widely used type of electrical circuit comprises an insulating support, such as a polyester film, having an integral tail extending therefrom and having a multiplicity of terminal sites, such as switch sites, on the film. Circuit conductors extend between and among the terminal sites and onto the tail so that they can be connected to further conductors. The conductors and the switch sites are commonly silkscreened on the insulaing support and are of conductive ink although in some cases, electro-deposited conductors are used.

In the design of membrane circuits as described above, it is highly desirable to lay out the circuit such that the conductors need not cross over each other. If crossovers can be avoided, all of the conductors and all of the terminal sites on the film can be produced by a single silkscreening operation. However, if the complexity of the circuit is such that crossovers cannot be avoided, it is necessary to apply an insulating layer to some of the conductors on the film and then carry out a second silk-screening operation to produce the conductors on the insulating film in crossing relationship to other conductors. These added steps greatly increase the manufacturing cost of membrance circuits and are avoided wherever possible.

Even if crossovers are not required in a circuit, the circuit designer attempts to lay out the conductors on the film in as simple a manner as possible so as to have relatively short runs between the terminal sites and ample distance between adjacent conductors so that the manufacturing operation can be carried out easily.

Many circuits produced by the manufacturing methods discussed above are relatively complex and crossovers are required if present circuit design principles are followed. It is also true that relatively complex circuits result involving relatively long conductors on the support and conductors which are very close to each other so that manufacturing difficulties are encountered.

The present invention is directed to the achievement of an improved tail for membrane type circuits which permits simplification of the layout of the circuit as compared with previously known circuit design techniques. The invention is thus directed to a membrane switch tail which will reduce the incidence of crossovers in the circuit and otherwise simplify the circuit.

An electrical circuit in accordance with the invention is of the type comprising an insulating support having a multiplicity of terminal sites thereon. A plurality of circuit conductors extend between and among the terminal sites and connect the terminal sites to each other. A flexible tail extends from the support and the circuit conductors have output terminal portions which are on one surface of the tail. The electrical circuit is characterized in that at least some of the circuit conductors are dual conductors having first and second conductor sections, the first and second conductor sections having first and second output terminal portions on the one surface of the tail. The first and second output terminal portions of each dual conductor are aligned with each other on opposite sides of a fold line and are equidistant from the fold line. The fold line divides the one surface of the tail into first and second tail surface sections. The tail is folded along the fold line so that the first and second tail surface sections are opposed to each other and the first and second output terminal portions of each dual conductor are opposed to, and in alignment with, each other, and the first and second output terminal portions of each dual conductor are connected to each other in the tail.

In accordance with a further embodiment, the plurality of circuit conductors and the flexible tail constitute a first plurality of circuit conductors and a first tail respectively and the circuit has a second plurality of circuit conductors and a second tail. The second plurality of circuit conductors have output terminal portions which are on the one surface of the second tail and at least some of the second circuit conductors being dual conductors having first and second conductor sections. The first and second conductor sections of the second circuit conductors have first and second output terminal portions on the one surface of the second tail, the first and second output terminal portions of each dual conductor of the second circuit conductors being aligned with each other on opposite sides of a second tail fold line and being equidistant from the second tail fold line. The second tail fold line divides the one surface of the second tail into first and second tail surface sections and the second tail is folded along the second tail fold line so that the first and second tail surface sections are opposed to each other and the first and second output terminal portions of each second dual conductor are opposed to, annd in alignment with, each other. The first and second output terminal portions of each dual conductor are conected to each other in the second tail whereby the circuit has first and second folded tails.

In accordance with a further embodiment, the second tail extends towards the first tail and end portions of the first tail and end portions of the second tail are in parallel planes and are in alignment with each other. The first and second output terminal portions on the second tail are on the end portions of the second tail and the first and second output terminal portions on the first tail are on the end portions of the first tail.

In accordance with a further embodiment, the first and second terminal portions of each dual conductor on the first tail are connected to each other by a connecting device which is crimped onto the first tail, and the first and second terminal output portions of each dual conductor on the second tail are connected to each other by a connecting device which is crimped onto the second tail.

THE DRAWING

FIG. 4 is a plan view of a circuit having a tail in accordance with an alternative embodiment of the invention.

FIG. 5 is a fragmentary view on an enlarged scale showing the alternative form of tail.

FIG. 6 is a view similar to FIG. 5 illustrating the folding operation of the tail.

FIG. 7 is a view illustrating the folding of the neck portion of the tail.

FIG. 8 is a view showing a connector installed on the tail.

DISCLOSED EMBODIMENTS

Figure 1:
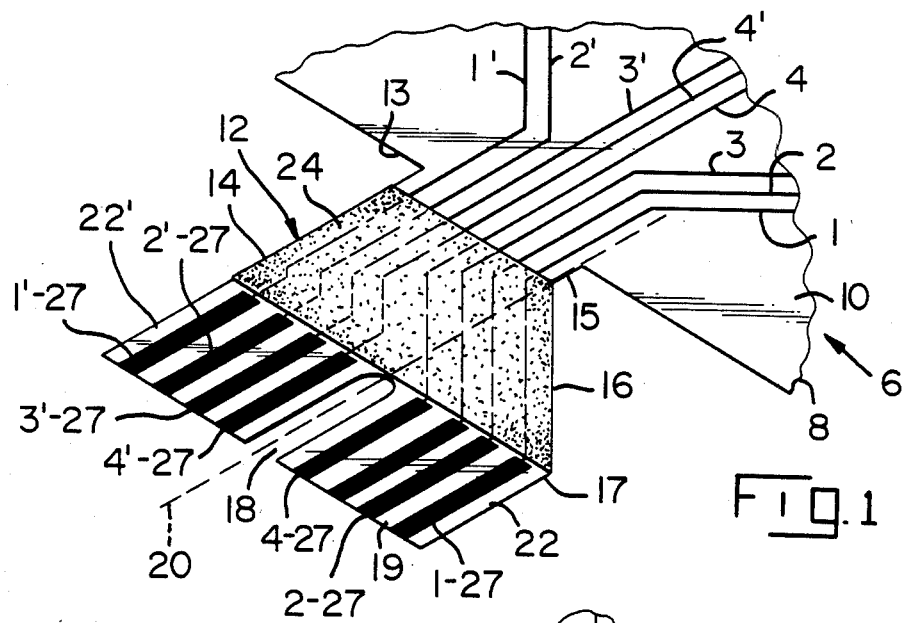
FIG. 1 is a perspective view of a portion of a membrane type circuit having a tail in accordance with one embodiment of the invention.

FIG. 1 shows an electrical circuit 6 of the type comprising an insulating support 8 of a material such as polyester film having an upper surface 10 upon which there are provided conductive lines as described below. An integral tail 12 extends from the edge 13 of the support, the tail having a left-hand edge 14, as viewed in FIG. 1 which extends normally from the edge 13 of the support 8. The right-hand edge extends normally for a short distance as shown at 15 and then extends diagonally away from the edge 13 as shown at 16. The tail 12 has an end portion 17 which has parallel side edges and a free end 19. A central notch 18 is provided in the end portion 17 and a fold line indicated at 20 extends through this notch and is in alignment with the side edge portion 15 as indicated by the dotted line in FIG. 1. The fold line 20 divides the end portion 17 into first and second tail surface sections 22', 22 respectively.

The first plurality of conductive lines 1, 2, 3, 4 are provided on surface 10 and extend onto the tail 12 and then laterally to the first tail surface section 22. The conductors 1-4 have enlarged output terminal portions 1-27, 2-27, 3-27, and 4-27 on their ends and on the surface 22. These output terminal portions are at increasing distances from the fold line 20.

The second plurality of conductive lines 1', 2', 3', and 4' are provided on surface 10 and extends onto the tail to output terminal portions 1'-27, 2'-27, 3'-27, and 4'-27 on the second tail surface section 22'. It will be seen that the output terminal sections 4-27 and 4'-27 are equidistant from the fold line 20 and that the remaining output terminal portions are similarly located.

A suitable insulating layer is applied to the portion of the tail extending from the end portion 17 to the end of the side edge 16 as indicated by the slight shading in this area 24. The conductors on this portion of the surface are thus covered but the output terminal portions are exposed in FIG. 1.

In the practice of invention, the first tail surface section 22 is folded about the fold line 20 towards the second tail surface section 22' so that the output terminal portion 1-27 will be against the output terminal portion 1'-27 and the remaining output terminal portions on surface 22 will be against and in alignment with their counterparts on the surface 22'.

Figure 2:
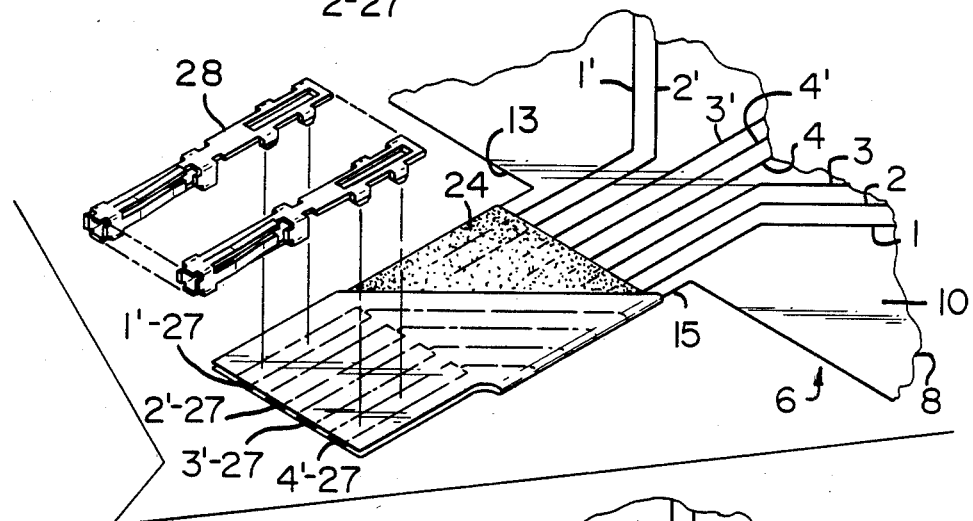
FIG. 2 is a view similar to FIG. 1 but showing the tail in its folded condition and showing terminals in alignment with the output terminal portions of the tail.

The corresponding output terminal portions are then connected to each other in any suitable manner. In the embodiment shown, terminals 28, FIG. 2, are crimped onto each pair of opposed aligned output terminal portions and the crimped connections force the surfaces against each other. After the crimped connections are in place, the conductor 1 will be electrically connected to the conductor 1' on the surface 10 and the conductors 2, 3, 4 will be electrically connected to the conductors 2', 3', 4'. The conductor 1, 1' is thus a dual conductor having two sections as are the remaining conductors 2, 3 and 4, and 2', 3', 4'.

Figure 3:
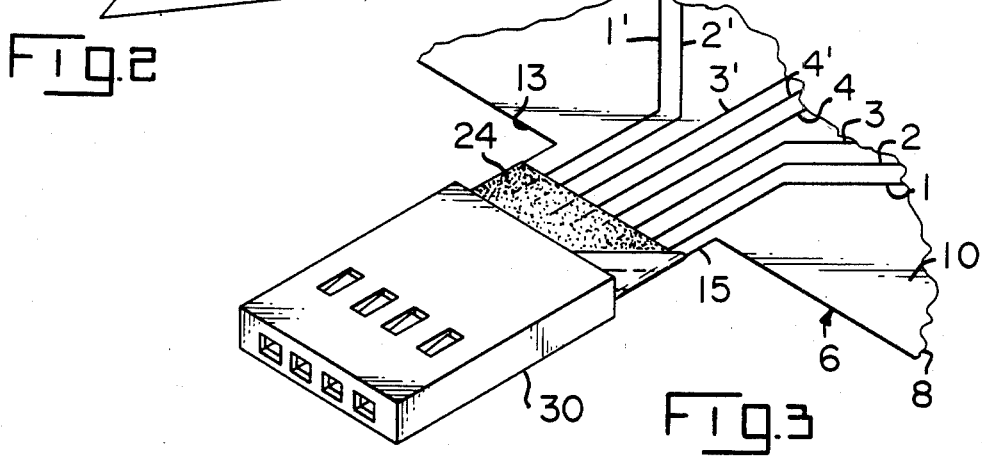
FIG. 3 is a view similar to FIG. 2 but showing a connector housing installed on the tail.

Since the corresponding conductors are connected to each other in the tail, the arrangement shown in FIGS. 1-3 permits the simplification of the circuit design under many circumstances which will avoid the need for crossovers in the circuit and/or will result in shorter conductors on the surface 10 and more generous spacing between adjacent conductors. In the embodiment shown, a connector housing 30 is installed on the ends of the tail so that the dual conductors can then be connected to further conductors as required.

FIGS. 4-8 show an alternative embodiment of the invention which illustrates the advantages achieved in the design of an actual circuit. FIG. 4 shows the actual circuit layout for a relatively complex keyboard and was reproduced directly from the artwork used to produce the stencil for the silkscreening operation. The circuit comprises a rectangular support 32 having a surface 34 on which there are provided two groups of switch sites 36, 38. The group of switch sites 36 represent the layout of a conventional typewriter keyboard and the switch sites 38 represent the layout of a rectangular array which is provided in conjunction with the keyboard layout. Arrangements of this type are commonly used on keyboards used for computers.

The embodiment of FIG. 4 has a first tail 40 and a second tail 42 which is beside the first tail and which is connected to the first tail by an integral neck portion 44. The first tail has first and second sections 46, 48 which are separated by a notch 50 and a tail fold line 52 extends centrally through this notch. The second tail is divided by a notch 50' into first and second sections 46', 48'. Conductors 54 extend from the surface 34 onto the first section 46 of the first tail and conductors 54' extend onto the first section 46' of the second tail 42. Conductors 56 extend onto the second section 48 of the first tail and conductors 56' extend onto the second section 48' of the second tail 42. The conductors have output terminal portions 58, 59, 58' and 59' as shown in FIG. 5.

A slot 60 is provided between the first and second tails 40, 42 and this slot extends laterally behind the tails as shown at 64, 64'. A neck fold line 62 extends medially through the slot and through the neck portion 44.

In the practice of the invention, the neck is first folded with respect to the neck fold line 62 downwardly as viewed in FIG. 5, it being assumed that the conductors are on the underside of the support 34. After this fold is made, the first section 46' of the second tail 42 will be against the first section 46 of the first tail 40 and the second section 48' will be against the second section 48. The output terminal portions 58' will thus be opposed to and against the output terminal portions 58 and the output terminal portions 59' will be against the output terminals portions 59 as shown in FIG. 6. The opposed output terminal portions can be connected to each other in any suitable manner. In the embodiment disclosed, terminals are crimped onto the tails as previously described.

After folding of the neck portion 44, the tail fold lines 52, 52' wll coincide and the notches 50, 50' will be aligned with each other. The second sections 48, 48' of the first and second tails can now be folded about the composite fold line 52 so that the output terminal portions will be arranged in two rows. The resulting multi-layer tail 66 can then be provided with a connector housing as shown at 68.

It will be apparent from the foregoing that the practice of the invention permits the circuit designer to lay out a relatively complex circuit without resorting to the use of crossovers or extremely long and intricate conductors on the surface of the membrane. The advantages of the invention in this respect can be appreciated from a careful study of FIG. 4 which, as mentioned above, shows an actual circuit produced for manufacturing. In the absence of the invention, it would be impossible, or nearly impossible, to produce the circuit shown in FIG. 4 without crossovers.

I claim:

1. An electrical circuit of the type comprising an insulating support having a multiplicity of terminal sites thereon, a plurality of circuit conductors extending between and among the terminal sites and connecting the terminal sites to each other, a flexible tail extending from the support, the circuit conductors having output terminal portions which are on one surface of the tail, the electrical circuit being characterized in that:
   at least some of the circuit conductors are dual conductors having first and second conductor sections, the first and second conductor sections having first and second output terminal portions on the one surface of the tail,
   the first and second output terminal portions of each dual conductor being aligned with each other on opposite sides of a fold line and being equidistant from the fold line, the fold line dividing the one surface of the tail into first and second tail surface sections,
   the tail being folded along the line so that the first and second tail surface sections are opposed to each other and the first and second output terminal portions of each dual conductor are opposed to, against and in electrical contact with, each other, whereby
   the first and second output terminal portions of each dual conductor are connected to each other in the tail to provide a common connection between preselected terminal sites.

2. An electrical circuit as set forth in claim 1 characterized in that the first and second output terminal portions of each dual conductor are connected to each other by a connecting device which is crimped onto the tail.

3. An electrical circuit as set forth in claim 2 characterized in that each of the connecting devices is a receptacle terminal.

4. An electrical circuit as set forth in claim 3 characterized in that the receptacle terminals are contained in a connector housing, 5. An electrical circuit as set forth in claim 1 characterized in that the terminal sites on the insulating support are switch sites.

6. An electrical circuit as set forth in claim 1 characterized in that the circuit conductors and the output terminal portions are of conductive ink.

7. An electrical circuit of the type comprising an insulating support having a multiplicity of terminal sites thereon, a plurality of circuit conductors extending between and among the terminal sites and connecting the terminal sites to each other, a first flexible tail extending from the support, the circuit conductors having output terminal portions which are on one surface of the first tail, the electrical circuit being characterized in that:
   a second flexible tail is provided, the second tail being beside the first tail and being connected to the first tail by a flexible neck portion, the second flexible tail having one surface which is beside the one surface of the first tail,
   at least some of the circuit conductors are dual conductors having first and second conductor sections, the first and second conductor sections having first and second output terminal portions on the one surface of the first tail and on the one surface of the second tail respectively,
   the first and second output terminal portions of each dual conductor being aligned with each other on opposite sides of a neck fold line and being equidistant from the neck fold line, the neck fold line extending between the first tail and the second tail and through the neck portion,
   the neck portion being folded along the neck fold line so that the one surface of the first tail is against the one surface of the second tail and first output terminal portions are against, and in electrical contact with, the second output terminal portions, whereby
   the first and second output terminal portions of each dual conductor are connected to each other to provide a common connection between preselected terminal sites.

8. An electrical circuit as set forth in claim 7 characterized in that the first and second tails are folded about a common tail fold line so that the first and second output terminal portions of the first and second output terminal portions of the first and second tails are arranged in two parallel rows.

9. An electrical circuit as set forth in claim 8 characterized in that the first and second output terminal portions of each dual conductor are connected to each other by terminals which are crimped onto the terminal portions.

10. An electrical circuit as set forth in claim 9 characterized in that the terminals are contained in a connector housing.

* * * * *